(12) United States Patent
Nekkanty et al.

(10) Patent No.: US 10,716,231 B2
(45) Date of Patent: Jul. 14, 2020

(54) PIN COUNT SOCKET HAVING REDUCED PIN COUNT AND PATTERN TRANSFORMATION

(71) Applicant: Intel Corporation, Santa Clara, CA (US)

(72) Inventors: Srikant Nekkanty, Chandler, AZ (US); Zhichao Zhang, Chandler, AZ (US); Kemal Aygun, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/146,908

(22) Filed: Sep. 28, 2018

(65) Prior Publication Data

US 2020/0107463 A1  Apr. 2, 2020

(51) Int. Cl.
| | |
|---|---|
| *H01R 12/00* | (2006.01) |
| *H05K 7/10* | (2006.01) |
| *H05K 1/11* | (2006.01) |
| *H05K 7/14* | (2006.01) |
| *H05K 1/02* | (2006.01) |

(52) U.S. Cl.
CPC ......... *H05K 7/1084* (2013.01); *H05K 1/0296* (2013.01); *H05K 1/115* (2013.01); *H05K 7/1459* (2013.01); *H05K 2201/10325* (2013.01); *H05K 2201/10371* (2013.01); *H05K 2201/10378* (2013.01)

(58) Field of Classification Search
CPC .... H05K 7/1084; H05K 1/115; H05K 1/0296; H05K 7/1459; H05K 2201/10378; H05K 2201/10371; H05K 2201/10325

USPC .............................................. 439/607.05, 66
See application file for complete search history.

(56) References Cited

U.S. PATENT DOCUMENTS

| | | | | |
|---|---|---|---|---|
| 6,443,745 B1 * | 9/2002 | Ellis | ..................... | H01R 23/688 439/101 |
| 7,368,814 B1 * | 5/2008 | Tully | ..................... | H05K 1/141 257/700 |
| 7,874,880 B2 * | 1/2011 | Fedde | ................ | H01R 13/2471 439/66 |
| 8,641,428 B2 * | 2/2014 | Light | .................. | H05K 3/4069 439/66 |
| 8,758,067 B2 * | 6/2014 | Rathburn | .............. | H01R 12/52 439/66 |

(Continued)

*Primary Examiner* — Abdullah A Riyami
*Assistant Examiner* — Nelson R. Burgos-Guntin
(74) *Attorney, Agent, or Firm* — Schwegman Lundberg & Woessner, P.A.

(57) ABSTRACT

An interposer and method of providing spatial and arrangement transformation are described. An electronic system has an electronic package, a motherboard and an interposer between the package and the motherboard. The interposer has signal and ground contacts on opposing surfaces that are respectively connected. The contacts opposing the package has a higher signal to ground contact ratio than the contacts opposing the motherboard, as well as different arrangements. Ground shielding vias in the interposer, which are connected to a ground plane, electrically isolate the signals through the interposer. The package may be mounted on a shielded socket such that signal and ground pins are mounted respectively in signal and ground socket mountings, ground shielding vias are between the signal socket mountings, and the ground socket mountings contain plated socket housings.

22 Claims, 4 Drawing Sheets

(56) References Cited

U.S. PATENT DOCUMENTS

| | | | | |
|---|---|---|---|---|
| 2002/0066591 A1* | 6/2002 | Li | .................. | H01L 23/49822 |
| | | | | 174/255 |
| 2003/0099097 A1* | 5/2003 | Mok | ................ | G01R 1/06716 |
| | | | | 361/767 |
| 2004/0223309 A1* | 11/2004 | Haemer | ............. | G01R 1/07314 |
| | | | | 361/767 |
| 2005/0196979 A1* | 9/2005 | Fedde | ................ | H01R 3/0207 |
| | | | | 439/66 |
| 2006/0125498 A1* | 6/2006 | Liu | .................. | G01R 31/2889 |
| | | | | 324/756.03 |
| 2008/0102702 A1* | 5/2008 | Sercu | ................ | H01R 23/688 |
| | | | | 439/607.05 |
| 2013/0029500 A1* | 1/2013 | Fan | ........................ | H01R 4/04 |
| | | | | 439/66 |
| 2013/0105984 A1* | 5/2013 | Rathburn | ........... | H01R 12/7076 |
| | | | | 257/773 |
| 2014/0048326 A1* | 2/2014 | Lin | ........................ | H05K 9/00 |
| | | | | 174/377 |
| 2016/0099512 A1* | 4/2016 | Ohsawa | ............. | H01R 12/7076 |
| | | | | 439/66 |

* cited by examiner

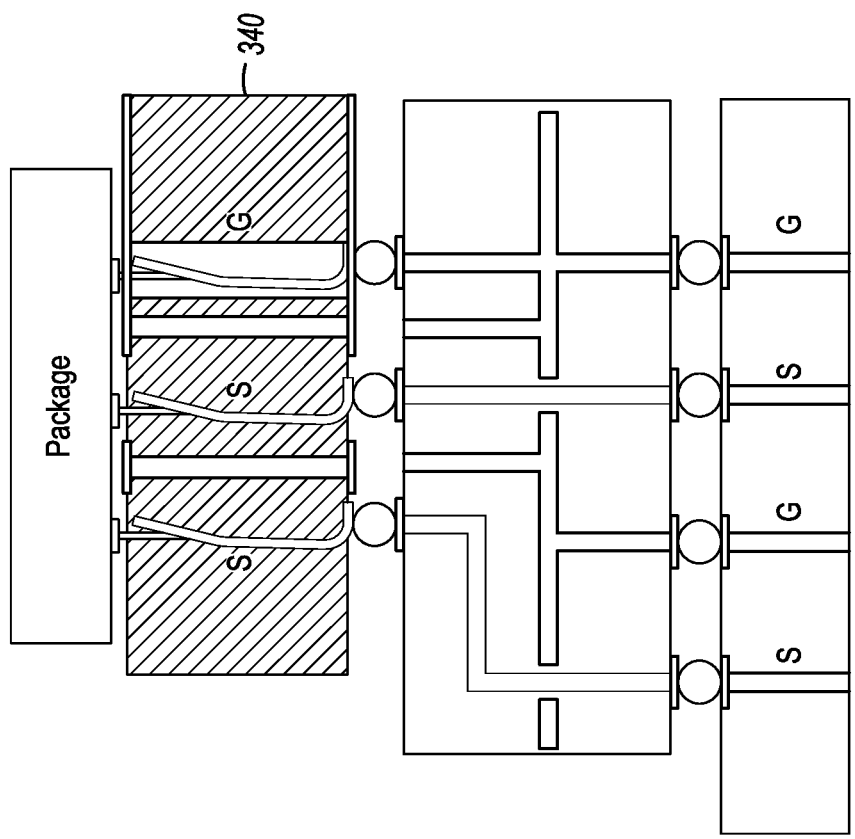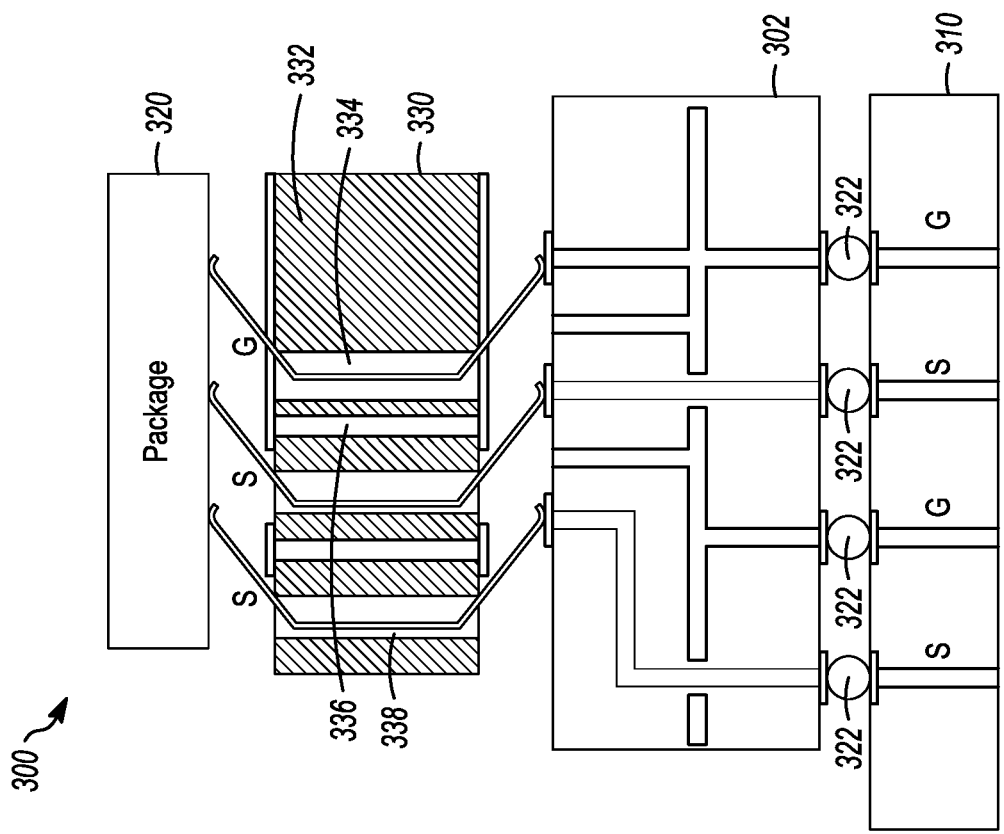
FIG. 3A
FIG. 3B

PIN COUNT SOCKET HAVING REDUCED PIN COUNT AND PATTERN TRANSFORMATION

TECHNICAL FIELD

This disclosure relates generally to sockets for electronic devices. Some embodiments are related to reducing the pin count in such sockets. Some embodiments are related to using shielding and spatial transformation to reduce the socket pin count.

BACKGROUND

Electronic devices continue to permeate every aspect of daily life. Among the many types of electronic devices such as computers, smartphones and other electronic communication devices that rely on microelectronics continue to grow, as does the desire for increased processing power. The complexity and density of the circuitry also continues to grow, leading to a number of design and processing issues. Among these issues is an increase in pin count for central processing unit (CPU) packages to increase the I/O and thus bandwidth, thereby increasing size of the package as well as the crosstalk between pins.

BRIEF DESCRIPTION OF THE DRAWINGS

FIGS. 3A and 3B illustrate a cross-sectional of electronic systems in accordance with some embodiments.

DESCRIPTION OF EMBODIMENTS

Figure 1:
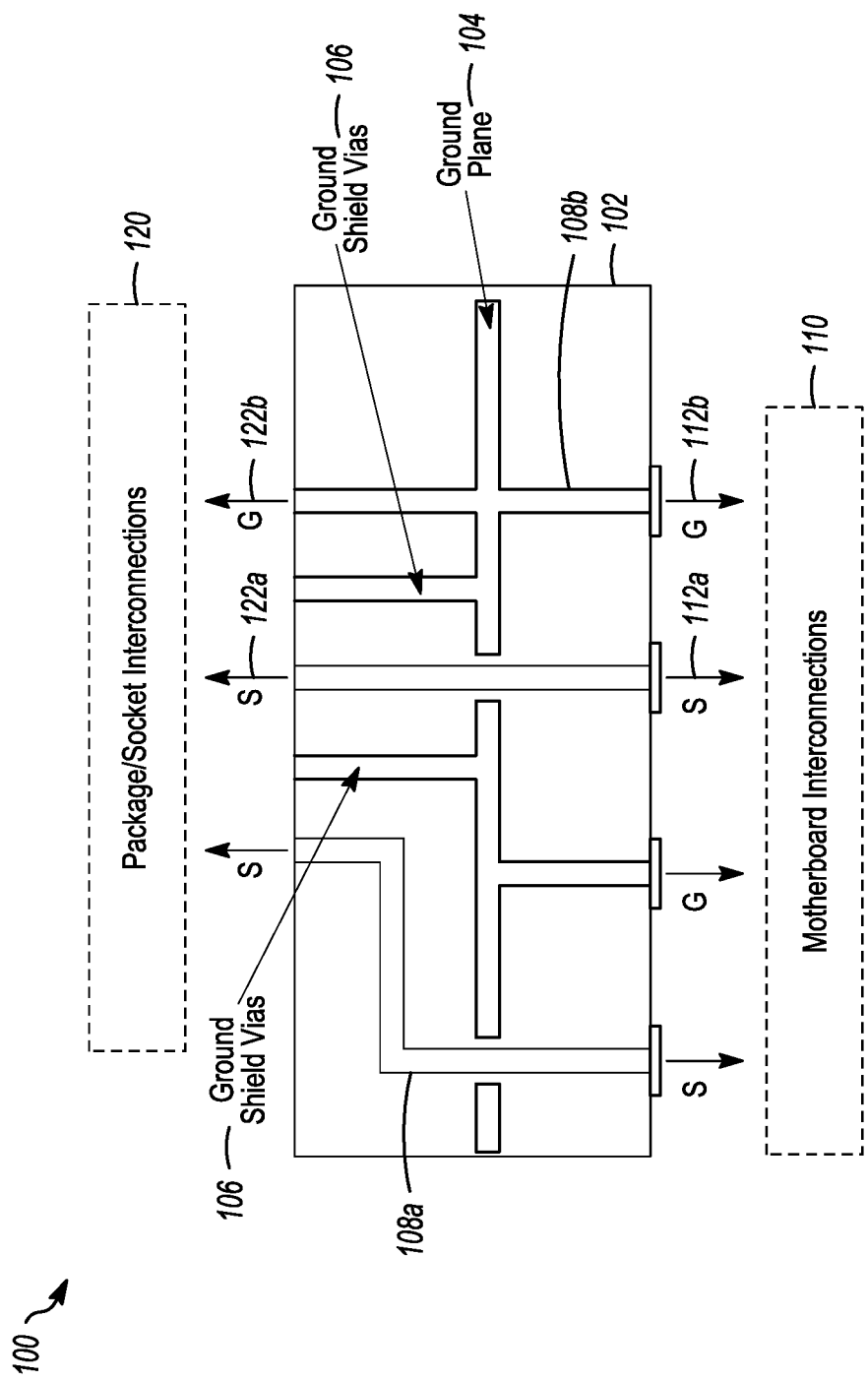
FIG. 1 illustrates a cross-sectional of an interposer in accordance with some embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation. In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an ASIC, an electronic circuit, a SOC, a processor (shared, dedicated, or group), and/or memory (shared, dedicated, or group) that execute one or more software or firmware programs, a combinational logic circuit, and/or other suitable components that provide the described functionality.

As above, a number of complexities arise with the increasing demand for speed and memory of electronics. This demand may result in an increase in the number of I/O signal pins in electronics packages, notably for central processing units (CPUs). An increase in the number of signal pins also increases the number of ground pins to provide an effective return path and to reduce crosstalk for high speed signaling. In different examples, the number of ground pins to signal pins is either 1:1 or 2:1. This increase in signal and ground pins leads to increase in both package size for a CPU and total enabling load for Land Grid Array (LGA) socket architecture. For server applications, the total CPU pin count may be greater than 8000-9000 in the next few generations. Unfortunately, increasing the size and total socket load drives up the packaging cost and technical complexity and is not sustainable and scalable for next generation products.

In some cases, the socket may be shielded by placing conductive structures inside the socket and shorting the structures with ground pins to provide ground isolation between the signal pins and reduce the number of ground pins. However, this does nothing to alleviate a sub-optimal return path that may occur in the motherboard, resulting in poor signal integrity for the entire channel, which includes the package, socket and motherboard. The signal integrity may be further improved by introducing ground shielding structures such as plated though holes/vias in the motherboard. However, the addition of such motherboard structures or changing the existing motherboard contact arrangement (signal and ground) may result in a significant increase in motherboard manufacturing complexity and cost, if even able to be altered.

Instead, or in addition, an interposer may be added between the socket and the motherboard to reduce the pin count (and thus the package size). In particular, the interposer may use both pitch translation and via shielding capability to increase the signal:ground ratio at the package side while retaining the baseline signal:ground ratio and design rules at the motherboard. The interposer may also decouple the 1:1 mapping between the package-socket interface and the socket-motherboard interface by allowing a relaxed signal:ground ratio as well as enabling crosstalk in the motherboard to be reduced without increasing the package dimensions or changing the motherboard design rules/pitch. For LGA applications, the pin count reduction may translate into a reduced enabling load, and therefore, lower complexity and cost for loading mechanisms. This may, benefit high layer server motherboards in particular, in which changes to the underlying structure by adding ground shielding to mitigate crosstalk can be cost prohibitive.

FIG. 1 illustrates a cross-sectional of an interposer in accordance with some embodiments. The interposer 100 may be designed to provide electrical connection between a motherboard 110 and an electronic package or socket for an electronic package 120 through one or more types of interconnections.

The interposer 100 may comprise an insulator 102 and one or more ground planes 104 in the insulator 102. The insulator 102 may be a single solid material or formed from multiple individual insulating layers 102. The insulator 102 may be formed from a polymer, polyimide, acrylic, FR4, glass flow, printed circuit board laminate or other insulating material with appropriate dielectric constants and loss tangents meeting electrical performance requirements.

Structures may be formed in the insulator 102. These structures may include integrated ground shielding structures such as ground shield vias 106 connected to the ground plane 104. The insulator 102 may also include signal connections 108a and ground connections 108b. The signal and ground connections 108a, 108b may be vias filled with conductive material. The ground shield vias 106, and signal and ground connections 108a, 108b may be formed from one or more conductive materials. Examples of these conductive materials may include, among others, copper (Cu), aluminum (Al), gold (Au), silver (Ag), nickel (Ni), palladium (Pd) or tungsten (W).

The signal connections 108a may be connected to motherboard-side signal contacts 112a on one surface of the interposer 100 and package-side signal contacts 122a on an opposing surface of the interposer 100. Similarly, the ground connections 108b may be connected to motherboard-side ground contacts 112b on one surface of the interposer 100 and package-side ground contacts 122b on an opposing surface of the interposer 100. The motherboard-side signal contacts 112a and motherboard-side ground contacts 112b may be configured to be connected to signal and ground lines, respectively, in the motherboard 110. The package-side signal contacts 122a and package-side ground contacts 122b may be configured to be connected to signal and ground connections, respectively, of the package or socket 120. The motherboard-side and package-side signal and ground contacts 112a, 112b, 122a, 122b may be planar on the surface on which they are disposed and formed from the same conductive material as above, e.g., Cu. The signal and ground connections of the package or socket may be, for example, pins of the package or socket or contacts of the socket.

The structures in the interposer 100 may decouple the contact mapping between the package and the motherboard and additionally create pitch translation. Accordingly, some of the signal connections 108a (and in some cases the ground connections 108b) may extend vertically straight through the interposer 100 such that the motherboard-side signal contacts 112a and package-side signal contacts 122a are aligned while others may not be straight (e.g., are laterally routed in at least one location between the motherboard-side signal contacts 112a and package-side signal contacts 122a to run parallel with the surface of the interposer 100). The interposer 100 may effectively preserve the same pin pattern, signal to ground (S:G) ratios and design rules at motherboard side interconnections. This may retain signal integrity in the motherboard. By the same token, the interposer 100 may allow the use of higher S:G ratios on the package side interconnection by replacing some of the ground connections 108b with the ground shield vias 106. In this case, the number of ground pins of the package may be reduced without reducing the number of ground connections in the interposer 100 and motherboard. This may enable an increased package pin count and/or a size reduction of the package.

Accordingly, in some embodiments, while the total number of motherboard-side signal contacts 112a and package-side signal contacts 122a may be the same, the total number of motherboard-side ground contacts 112b may be greater than the number of package-side ground contacts 122b. The S:G ratio at the motherboard side may be about 1:1 while the S:G ratio at the package side may be substantially greater (e.g., 2:1, 3:1, 4:1, 5:1, 6:1).

Figure 2:
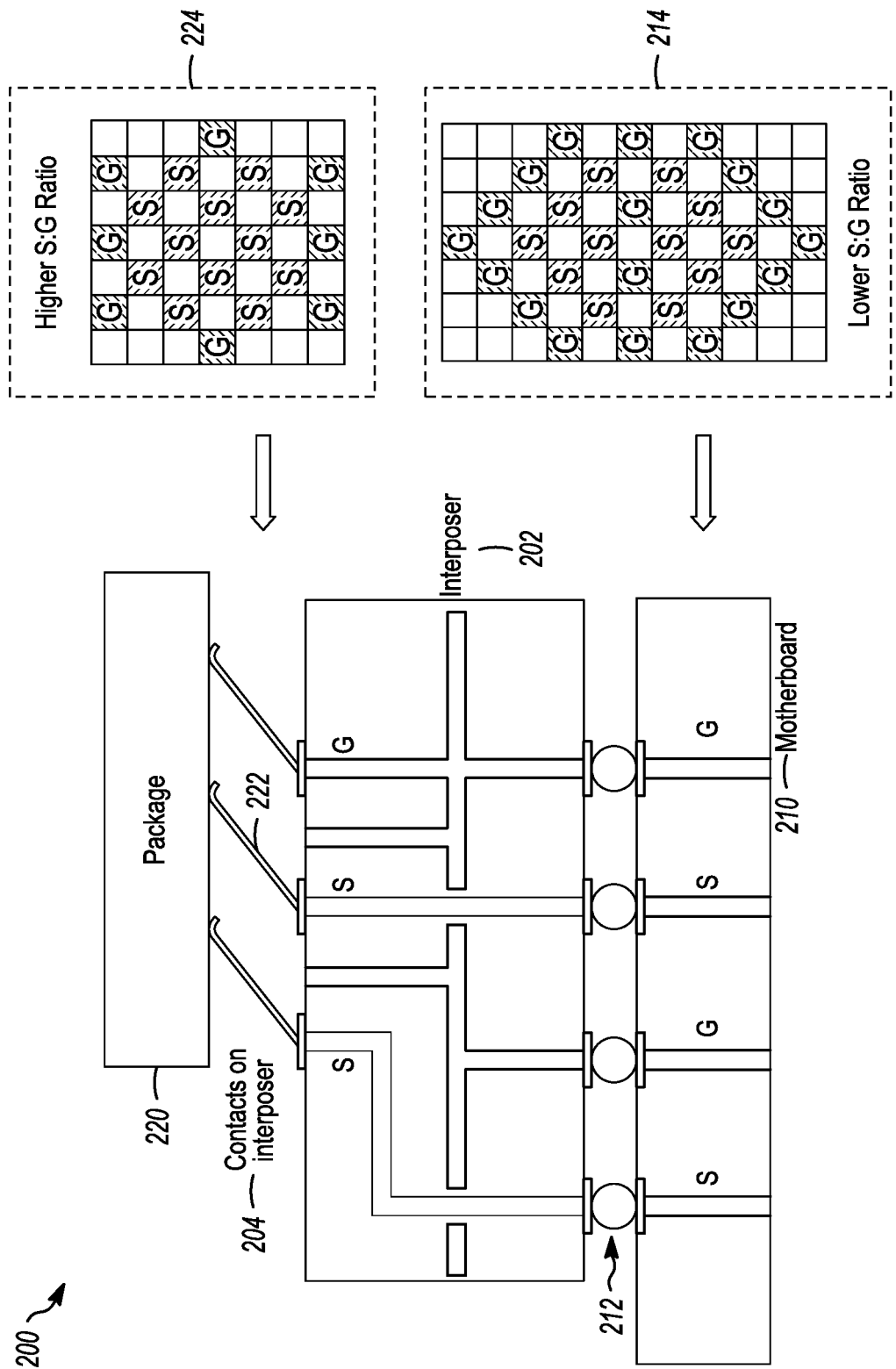
FIG. 2 illustrates a cross-sectional of an electronic system in accordance with some embodiments.

FIG. 2 illustrates a cross-sectional of an electronic system in accordance with some embodiments. The system 200 shows the interposer 202, the motherboard 210 and the package 220. The interposer 202 may be similar to that shown and described in more detail in FIG. 1.

Thus, the interposer 202 may comprise an insulator and one or more ground planes in the insulator. The insulator may be a single solid material or formed from multiple individual insulating layers such as that provided above. Structures formed in the insulator may include integrated ground shielding structures such as ground shield vias connected to the ground plane, signal connections and ground connections. Each of the integrated ground shielding structures may be formed from one or more conductive materials, as indicated above. The signal and ground contacts may be connected to motherboard-side signal and ground contacts, respectively, on one surface of the interposer 202 and package-side signal and ground contacts, respectively, on an opposing surface of the interposer 202. The structures in the interposer 202 may decouple the contact mapping between the motherboard 210 and the package 220 and additionally create pitch translation in the manner similar to the above such that some of the signal contacts extend vertically straight through the interposer 202 while others are laterally routed through the interposer 202.

The motherboard 210 and the package 220 may each comprise circuitry appropriate to the functionality provided by the motherboard 210 and the package 220. The pins 222 on the package 220 may provide electrical connections between the circuitry in the package 220 and the package-side contacts 204 on the surface of the interposer 202. Similarly, solder balls 212 or other means of connection may provide electrical connections between the circuitry in the motherboard 210 and the motherboard-side contacts 204 on the opposing surface of the interposer 202.

The pin-out of the package 220 and package-side contact arrangement 224 on the interposer 202 may differ from the motherboard-side contact arrangement 214 on the interposer 202 and on the motherboard 210. FIG. 2 shows an example of a unit cell pattern for each arrangement, which may be duplicated to obtain the overall arrangement. As shown, the motherboard-side contact arrangement 214 may have a pattern in which groups of signal contacts are surrounded by a greater number of the ground contacts. For example, as shown, the motherboard-side contact arrangement 214 may have a bowtie pattern in which groups of signal contacts are surrounded and bisected by the ground contacts. The package-side contact arrangement 224, on the other hand, may have an arrangement in which the same number of signal contacts are surrounded by the ground contacts without being bisected. As above, the S:G ratio at the motherboard-side contact arrangement 214 may be about 1:1, with some of the ground contacts counting as ½ a ground contact due to being shared among unit cells (with other ground contacts unshared among unit cells and thus counting as a full ground contact). The pattern of the package-side contact arrangement 224 has a higher S:G ratio (e.g., 4:1) than that of the motherboard-side contact arrangement.

FIGS. 3A and 3B illustrate a cross-sectional of electronic systems in accordance with some embodiments. The system 300 contains the interposer 302, the motherboard 310 and the package 320. In addition to the system shown in FIG. 2, however, the system 300 further contains a shielded socket 330 into which the package 320 is disposed and through which the package 320 makes electrical contact with the interposer 302 (and thence the motherboard 310). The interposer 302 may be scalable to alternate socket contact technologies such as dual LGA as shown in FIG. 3A, or Low Insertion Force (LIF) or Pin Grid Array (PGA) sockets as shown in FIG. 3B. The combination of the interposer 302 and a shielded socket 330 may be referred to as an electronic package adapter.

The shielded socket 330 may be shielded by adding grounding structures 334, 336 in the insulator 332 to isolate the signal pins (S) of the package 320. The grounding structures 334, 336 are shorted to each other. The insulating and conductive materials in the shielded socket 330 may be the same as those described above in relation to the interposer 302. The signal pins of the package 320 may be disposed in signal socket housings 338. The ground pins (G) of the package 320 may be disposed in ground socket housings 334. As shown in FIG. 3A, the signal pins and ground pins extend through the shielded socket 330 to contact the signal and ground contacts, respectively, of the interposer 302. In other embodiments, as shown in FIG. 3B, the pins of the package may contact leads in the shielded socket 340 and contacts of the shielded socket 340 contact the contacts of the interposer 302 through solder balls 322 or other conductive structures. Contacts on the interposer may be used if total socket stack height is a constraint. In addition, underfill may be used to ensure reliable solder joints between the shielded socket 340 and interposer 302. In underfill, epoxy is used after attachment between the shielded socket 340 and interposer 302 to avoid reflow of the solder when attaching the interposer 302 and motherboard 310.

The grounding structures in the shielded socket 330 may further include ground shielding vias 336 between the signal socket housings 338. The ground socket housings 334 may also be plated to short the ground shielding vias 336 to both the ground socket housings 334 and the ground pins of the package 320. The ground shielding vias 336 may be filled with conductive material. The arrangement of the signal socket housings 338 and ground socket housings 334 may be the same throughout the shielded socket 330, and have the enhanced S:G ratio of the package 320; that is, the interposer 302 only may provide the spatial/pitch and pattern transformation to connect to the motherboard 310.

The interposer 302 may be similar to that shown and described in more detail in FIG. 1. The motherboard 310 and the package 320 may each comprise circuitry appropriate to the functionality provided by the motherboard 310 and the package 320. The pins 222 on the package 320 may provide electrical connections between the circuitry in the package 320 and the package-side contacts 304 on the surface of the interposer 302. Similarly, solder balls or other means of connection may provide electrical connections between the circuitry in the motherboard 310 and the motherboard-side contacts 304 on the opposing surface of the interposer 302.

Thus, as shown in FIG. 2, the package may be connected to the interposer directly, replacing the plastic socket housing with the interposer. Alternatively, as shown in FIGS. 3A and 3B, a high electrical performance socket (such as a shielded socket) may be used to connect the package to the interposer. Although the interposer shown contains vias filled with a conductor, in other embodiments, some of the signal and/or ground vias may be sockets, with connectors to the motherboard-side contacts in a manner similar to that of the shielded socket shown in FIG. 3B.

Figure 4:
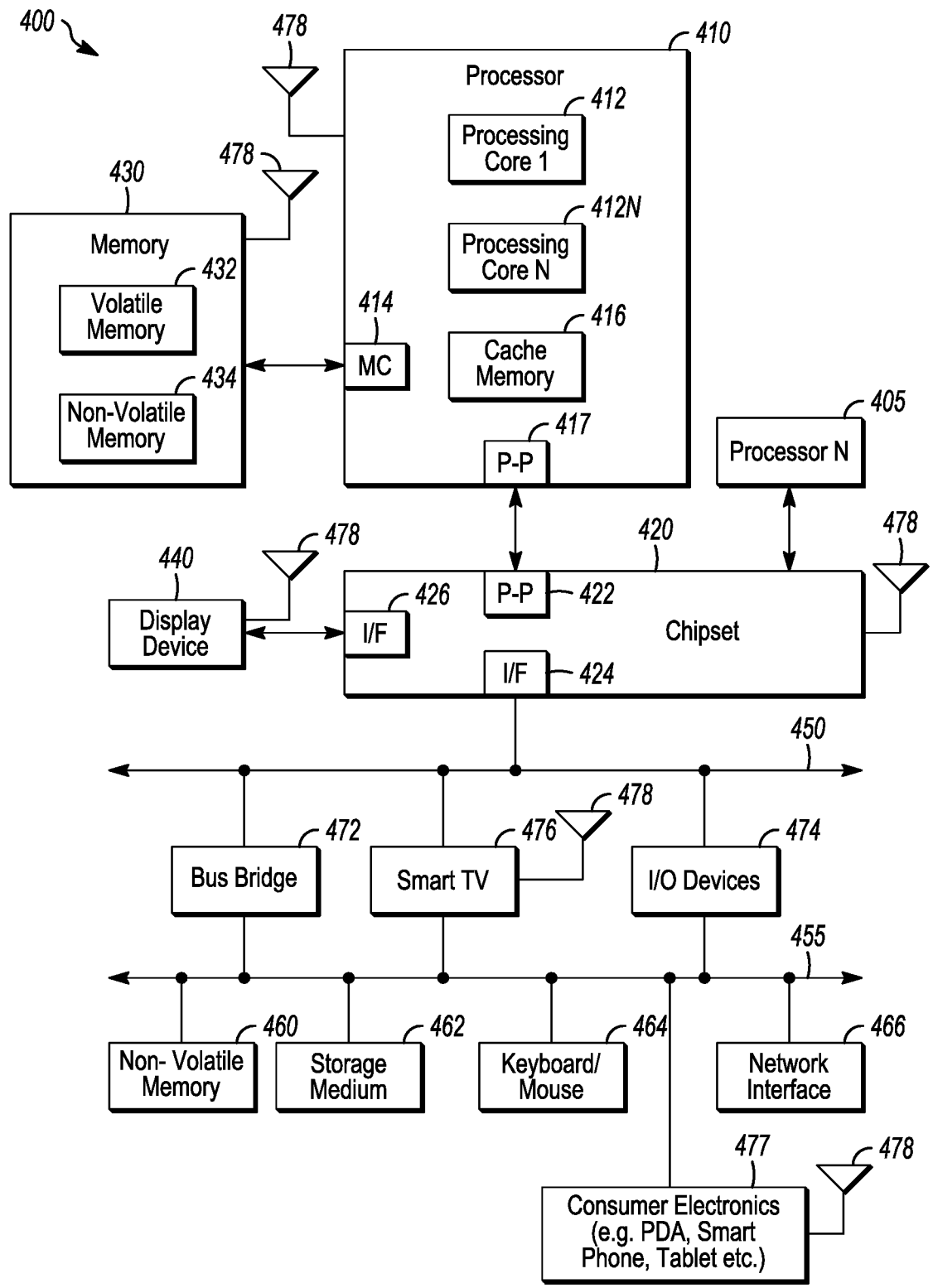
FIG. 4 illustrates a system level diagram of circuitry using the methods described herein.

FIG. 4 illustrates a system level diagram of circuitry using the methods described herein. In one embodiment, system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 400 is a system on a chip (SOC) system.

In one embodiment, processor 410 has one or more processor cores 412 and 412N, where 412N represents the Nth processor core inside processor 410 where N is a positive integer. In one embodiment, system 400 includes multiple processors including 410 and 405, where processor 405 has logic similar or identical to the logic of processor 410. In some embodiments, processing core 412 includes, but is not limited to, pre-fetch logic to fetch instructions, decode logic to decode the instructions, execution logic to execute instructions and the like. In some embodiments, processor 410 has a cache memory 416 to cache instructions and/or data for system 400. Cache memory 416 may be organized into a hierarchal structure including one or more levels of cache memory.

In some embodiments, processor 410 includes a memory controller 414, which is operable to perform functions that enable the processor 410 to access and communicate with memory 430 that includes a volatile memory 432 and/or a non-volatile memory 434. In some embodiments, processor 410 is coupled with memory 430 and chipset 420. Processor 410 may also be coupled to a wireless antenna 478 to communicate with any device configured to transmit and/or receive wireless signals. In one embodiment, an interface for wireless antenna 478 operates in accordance with the 4GPP and/or IEEE 402.11 standard protocol, Home Plug AV (HPAV), Ultra Wide Band (UWB), Bluetooth, WiMax, or any form of wireless communication protocol.

In some embodiments, volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 434 includes, but is not limited to, flash memory, phase change memory (PCM), read-only memory (ROM), electrically erasable programmable read-only memory (EEPROM), or any other type of non-volatile memory device.

Memory 430 stores information and instructions to be executed by processor 410. In one embodiment, memory 430 may also store temporary variables or other intermediate information while processor 410 is executing instructions. In the illustrated embodiment, chipset 420 connects with processor 410 via Point-to-Point (PtP or P-P) interfaces 417 and 422. Chipset 420 enables processor 410 to connect to other elements in system 400. In some embodiments of the example system, interfaces 417 and 422 operate in accordance with a PtP communication protocol such as the Intel® QuickPath Interconnect (QPI) or the like. In other embodiments, a different interconnect may be used.

In some embodiments, chipset 420 is operable to communicate with processor 410, 405N, display device 440, and other devices, including a bus bridge 472, a smart TV 476, I/O devices 474, nonvolatile memory 460, a storage medium (such as one or more mass storage devices) 462, a keyboard/mouse 464, a network interface 466, and various forms of consumer electronics 477 (such as a PDA, smart phone, tablet etc.), etc. In one embodiment, chipset 420 couples with these devices through an interface 424. Chipset 420 may also be coupled to a wireless antenna 478 to communicate with any device configured to transmit and/or receive wireless signals.

Chipset 420 connects to display device 440 via interface 426. Display 440 may be, for example, a liquid crystal display (LCD), a light emitting diode (LED) array, an organic light emitting diode (OLED) array, or any other form of visual display device. In some embodiments of the example system, processor 410 and chipset 420 are merged into a single SOC. In addition, chipset 420 connects to one or more buses 450 and 455 that interconnect various system elements, such as I/O devices 474, nonvolatile memory 460, storage medium 462, a keyboard/mouse 464, and network interface 466. Buses 450 and 455 may be interconnected together via a bus bridge 472.

In one embodiment, mass storage device 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the 4GPP standard and its related family, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into processor core 412.

ADDITIONAL NOTES AND EXAMPLES

Example 1 is an electronic package adapter comprising: an interposer comprising a first plurality of contacts on a first surface and a second plurality of contacts on a second surface opposing the first surface, wherein the first plurality of contacts is in electrical contact with the second plurality of contacts, the first plurality of contacts has a configuration pattern for electrical contact with an electronic package, the second plurality of contacts has a configuration pattern for electrical contact with a motherboard, and the first and second plurality of contacts have different numbers of contacts.

In Example 2, the subject matter of Example 1 includes, wherein: the first and second plurality of contacts comprise ground and signal contacts, and the first plurality of contacts has a higher ratio of signal contacts to ground contacts than the second plurality of contacts.

In Example 3, the subject matter of Example 2 includes, wherein: the number of the second plurality of contacts is larger than that of the first plurality of contacts.

In Example 4, the subject matter of Examples 1-3 includes, wherein: the first and second plurality of contacts have different arrangements of ground and signal contacts.

In Example 5, the subject matter of Example 4 includes, wherein: the first plurality of contacts has a plurality of first cells, each first cell having the signal contacts of the first cell surrounded by the ground contacts of the first cell.

In Example 6, the subject matter of Example 5 includes, wherein: the second plurality of contacts has a plurality of second cells, each second cell having a pattern in which the signal contacts of the second cell are surrounded by the ground contacts of the second cell, and the ground contacts of the second cell are fewer than the ground contacts of the first cell.

In Example 7, the subject matter of Example 6 includes, wherein: the number of signal contacts of each first and second cell are equal.

In Example 8, the subject matter of Examples 1-7 includes, wherein the interposer further comprises: ground shielding vias between signal connections that connect signal contacts of the first and second plurality of contacts, each signal connection isolated by the ground shielding vias, and a ground plane to which the ground shielding vias are connected.

In Example 9, the subject matter of Example 8 includes, wherein: at least some of the signal connections extend vertically straight through the interposer and at least some of the signal connections are bent.

In Example 10, the subject matter of Examples 1-9 includes, a shielded socket having signal socket housings for signal pins of the package and ground socket housings for ground pins of the package, wherein the shielded socket comprises ground shielding vias between the signal socket housings, and the ground socket housings comprise plated socket housings to short the ground pins.

In Example 11, the subject matter of Example 10 includes, wherein: spatial and arrangement transformation of signals and ground from the package to the motherboard occurs in the interposer and does not occur in the shielded socket.

In Example 12, the subject matter of Examples 1-11 includes, wherein: the first plurality of contacts has smaller pin-to-pin pitch than the second plurality of contacts.

Example 13 is an interposer comprising: a first set of contacts on a first surface; a second set of contacts on a second surface opposing the first surface; and an insulator disposed between the first and second surfaces, the insulator comprising vias through which the first and second set of contacts are electrically connected, wherein the first and second set of contacts comprises signal and ground contacts and have different ratios of signal to ground contacts.

In Example 14, the subject matter of Example 13 includes, wherein: the first set of contacts has a configuration pattern for electrical contact with an electronic package, the second set of contacts has a configuration pattern for electrical contact with a motherboard, and the first set of contacts has a higher ratio of signal contacts to ground contacts than the second set of contacts.

In Example 15, the subject matter of Example 14 includes, wherein: the first set of contacts has first cells, each first cell having the signal contacts of the first cell surrounded by the ground contacts of the first cell, the second set of contacts second cells, each second cell having a pattern in which the signal contacts of the second cell are surrounded by the ground contacts of the second cell, the ground contacts of the second cell are fewer than the ground contacts of the first cell, and the number of signal contacts of each first and second cell are equal.

In Example 16, the subject matter of Examples 14-15 includes, wherein the insulator further comprises: ground shielding vias between the vias connecting signal contacts of the first and second set of contacts.

In Example 17, the subject matter of Example 16 includes, wherein: each signal via is electrically isolated from other signal vias by the ground shielding vias, and the insulator further comprises a ground plane to which the ground shielding vias are connected.

Example 18 is an electronic system comprising: an electronic package containing package circuitry and signal and ground pins extending from the package and configured to provide signals and ground, respectively, to the package circuitry; a motherboard containing motherboard circuitry and motherboard signal and ground contacts configured to provide signals and ground, respectively, between the motherboard circuitry and the package circuitry; and an interposer between the package and the motherboard, the interposer comprising: a first set of signal and ground contacts on a first surface opposing the package; a second set of signal and ground contacts on a second surface opposing the motherboard; and an insulator disposed between the first and second surfaces, the insulator comprising vias through which the first and second set of signal contacts are electrically connected and the first and second set of ground contacts are electrically connected, wherein the first set of signal and ground contacts has a higher ratio of signal to ground contacts than the second set of signal and ground contacts.

In Example 19, the subject matter of Example 18 includes, wherein the insulator further comprises: ground shielding vias between the vias connecting signal contacts of the first and second set of contacts, each signal via electrically isolated from other signal vias by the ground shielding vias, and a ground plane to which the ground shielding vias are connected.

In Example 20, the subject matter of Examples 18-19 includes, a shielded socket on which the package is mounted, the shielded socket having signal socket mountings for the signal pins of the package and ground socket mountings for the ground pins of the package, wherein the shielded socket comprises ground shielding vias between the signal socket mountings, and the ground socket mountings comprise plated socket housings.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The invention claimed is:

1. An electronic package adapter comprising:
an interposer comprising a first plurality of contacts on a first surface and a second plurality of contacts on a second surface opposing the first surface, the first and second plurality of contacts extend parallel with the first and second surfaces,
wherein the first plurality of contacts is in electrical contact with the second plurality of contacts,
the first plurality of contacts has a configuration pattern for electrical contact with an electronic package,
the second plurality of contacts has a configuration pattern for electrical contact with a motherboard, and
the first and second plurality of contacts have different numbers of contacts.

2. The electronic package adapter of claim 1, wherein:
the first and second plurality of contacts comprise ground and signal contacts, and
the first plurality of contacts has a higher ratio of signal contacts to ground contacts than the second plurality of contacts.

3. The electronic package adapter of claim 2, wherein:
the number of the second plurality of contacts is larger than that of the first plurality of contacts.

4. The electronic package adapter of claim 1, wherein:
the first and second plurality of contacts have different arrangements of ground and signal contacts.

5. The electronic package adapter of claim 4, wherein:
the first plurality of contacts has a plurality of first cells, each first cell having the signal contacts of the first cell surrounded by the ground contacts of the first cell.

6. The electronic package adapter of claim 5, wherein:
the second plurality of contacts has a plurality of second cells, each second cell having a pattern in which the signal contacts of the second cell are surrounded by the ground contacts of the second cell, and
the ground contacts of the second cell are fewer than the ground contacts of the first cell.

7. The electronic package adapter of claim 6, wherein:
the number of signal contacts of each first and second cell are equal.

8. The electronic package adapter of claim 1, wherein the interposer further comprises:
ground shielding vias between signal connections that connect signal contacts of the first and second plurality of contacts, each signal connection isolated by the ground shielding vias, and
a ground plane to which the ground shielding vias are connected.

9. The electronic package adapter of claim 8, wherein:
at least some of the signal connections extend vertically straight through the interposer and at least some of the signal connections are bent.

10. The electronic package adapter of claim 1, further comprising:
a shielded socket having signal socket housings for signal pins of the package and ground socket housings for ground pins of the package,
wherein the shielded socket comprises ground shielding vias between the signal socket housings, and
the ground socket housings comprise plated socket housings to short the ground pins.

11. The electronic package adapter of claim 10, wherein:
spatial and arrangement transformation of signals and ground from the package to the motherboard occurs in the interposer and does not occur in the shielded socket.

12. The electronic package adapter of claim 1, wherein:
the first plurality of contacts has smaller pin-to-pin pitch than the second plurality of contacts.

13. An interposer comprising:
a first set of contacts on a first surface;
a second set of contacts on a second surface opposing the first surface, the first and second set of contacts extend parallel with the first and second surfaces; and
an insulator disposed between the first and second surfaces, the insulator comprising vias through which the first and second set of contacts are electrically connected,
wherein the first and second set of contacts comprises signal and ground contacts and have different ratios of signal to ground contacts.

14. The interposer of claim 13, wherein:
the first set of contacts has a configuration pattern for electrical contact with an electronic package,
the second set of contacts has a configuration pattern for electrical contact with a motherboard, and
the first set of contacts has a higher ratio of signal contacts to ground contacts than the second set of contacts.

15. The interposer of claim 14, wherein:
the first set of contacts has first cells, each first cell having the signal contacts of the first cell surrounded by the ground contacts of the first cell,
the second set of contacts second cells, each second cell having a pattern in which the signal contacts of the second cell are surrounded by the ground contacts of the second cell,
the ground contacts of the second cell are fewer than the ground contacts of the first cell, and
the number of signal contacts of each first and second cell are equal.

16. The interposer of claim 14, wherein the insulator further comprises:
ground shielding vias between the vias connecting signal contacts of the first and second set of contacts.

17. The interposer of claim 16, wherein:
each signal via is electrically isolated from other signal vias by the ground shielding vias, and
the insulator further comprises a ground plane to which the ground shielding vias are connected.

18. An electronic system comprising:
an electronic package containing package circuitry and signal and ground pins extending from the package and configured to provide signals and ground, respectively, to the package circuitry;
a motherboard containing motherboard circuitry and motherboard signal and ground contacts configured to provide signals and ground, respectively, between the motherboard circuitry and the package circuitry; and
an interposer between the package and the motherboard, the interposer comprising:
a first set of signal and ground contacts on a first surface opposing the package;
a second set of signal and ground contacts on a second surface opposing the motherboard the first and second set of signal and ground contacts extend parallel with the first and second surfaces; and
an insulator disposed between the first and second surfaces, the insulator comprising vias through which the first and second set of signal contacts are electrically connected and the first and second set of ground contacts are electrically connected,
wherein the first set of signal and ground contacts has a higher ratio of signal to ground contacts than the second set of signal and ground contacts.

19. The electronic system of claim 18, wherein the insulator further comprises:
ground shielding vias between the vias connecting signal contacts of the first and second set of contacts, each signal via electrically isolated from other signal vias by the ground shielding vias, and
a ground plane to which the ground shielding vias are connected.

20. The electronic system of claim 18, further comprising:
a shielded socket on which the package is mounted, the shielded socket having signal socket mountings for the signal pins of the package and ground socket mountings for the ground pins of the package,
wherein the shielded socket comprises ground shielding vias between the signal socket mountings, and
the ground socket mountings comprise plated socket housings.

21. The electronic package adapter of claim 1, wherein:
the interposer further comprises an insulator through which the first and second plurality of contacts are connected,
adjacent contacts of the first plurality of contacts are isolated in laterally perpendicular directions by the insulator, the laterally perpendicular directions parallel with the first and second surfaces, and
adjacent contacts of the second plurality of contacts are isolated in the laterally perpendicular directions by the insulator.

22. The electronic package adapter of claim 1, wherein:
the interposer is substantially rectangular,
an entirety of the first plurality of contacts is substantially collinear with a portion of the first surface between the first plurality of contacts, and
an entirety of the second plurality of contacts is substantially collinear with a portion of the second surface between the second plurality of contacts.

* * * * *